(12) United States Patent
Son et al.

(10) Patent No.: US 12,463,114 B2
(45) Date of Patent: *Nov. 4, 2025

(54) SEMICONDUCTOR CHIP INCLUDING THROUGH ELECTRODE, AND SEMICONDUCTOR PACKAGE INCLUDING THE SAME

(71) Applicant: SK hynix Inc., Icheon-si (KR)

(72) Inventors: Ho Young Son, Icheon-si (KR); Sung Kyu Kim, Icheon-si (KR); Mi Seon Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/615,528

(22) Filed: Mar. 25, 2024

(65) Prior Publication Data

US 2024/0234255 A1 Jul. 11, 2024

Related U.S. Application Data

(63) Continuation of application No. 18/489,557, filed on Oct. 18, 2023, which is a continuation of application
(Continued)

(30) Foreign Application Priority Data

Nov. 25, 2020 (KR) .................. 10-2020-0159887

(51) Int. Cl.
*H01L 23/48* (2006.01)
*H01L 23/00* (2006.01)
*H01L 25/065* (2023.01)

(52) U.S. Cl.
CPC ............ *H01L 23/481* (2013.01); *H01L 24/16* (2013.01); *H01L 25/0657* (2013.01); *H01L 2224/16146* (2013.01); *H01L 2225/06513* (2013.01)

(58) Field of Classification Search
CPC . H01L 2224/16145; H01L 2224/32145; H01L 2225/06541; H01L 21/76898;
(Continued)

(56) References Cited

U.S. PATENT DOCUMENTS 8,912,654 B2 12/2014 Kreupl et al.
10,468,379 B1 11/2019 Liu et al.
(Continued)

FOREIGN PATENT DOCUMENTS

CN 110277361 A 9/2019
JP 2013093626 A 5/2013
(Continued)

*Primary Examiner* — Mamadou L Diallo
(74) *Attorney, Agent, or Firm* — WILLIAM PARK AND ASSOCIATES LTD.

(57) ABSTRACT

A semiconductor chip may include: a body portion with a front surface and a rear surface; a pair of through electrodes penetrating the body portion; an insulating layer disposed over the rear surface of the body portion and the pair of through electrodes; and a rear connection electrode disposed over the insulating layer and connected simultaneously with the pair of through electrodes, wherein a distance between the pair of through electrodes is greater than twice a thickness of the insulating layer.

17 Claims, 9 Drawing Sheets

Related U.S. Application Data

No. 18/103,346, filed on Jan. 30, 2023, now Pat. No. 11,823,982, which is a continuation of application No. 17/191,287, filed on Mar. 3, 2021, now Pat. No. 11,594,471.

(58) Field of Classification Search
CPC . H01L 23/49827; H01L 23/481; H01L 24/16; H01L 25/0657; H01L 2224/16146; H01L 2225/06513

See application file for complete search history.

(56) References Cited

U.S. PATENT DOCUMENTS

| | | |
|---|---|---|
| 2009/0189267 A1 | 7/2009 | Kim et al. |
| 2011/0006433 A1 | 1/2011 | Kanetaka |
| 2011/0084365 A1 | 4/2011 | Law et al. |
| 2011/0193212 A1 | 8/2011 | Gu et al. |
| 2011/0291265 A1 | 12/2011 | Jin et al. |
| 2013/0082382 A1 | 4/2013 | Torii |
| 2013/0221493 A1 | 8/2013 | Kim et al. |
| 2013/0258792 A1 | 10/2013 | Kitano et al. |
| 2013/0264720 A1 | 10/2013 | Chun et al. |
| 2013/0313690 A1 | 11/2013 | Miyazaki |
| 2014/0014958 A1* | 1/2014 | Oh .................. H01L 22/00 257/48 |
| 2014/0210066 A1 | 7/2014 | Nagano et al. |
| 2015/0008588 A1* | 1/2015 | Kim .................. H01L 23/373 257/774 |
| 2015/0116968 A1 | 4/2015 | Yamada et al. |
| 2015/0123278 A1 | 5/2015 | Park et al. |
| 2015/0179558 A1 | 6/2015 | Kim |
| 2015/0277106 A1 | 10/2015 | Ozaki et al. |
| 2016/0155724 A1 | 6/2016 | Kim et al. |
| 2016/0225679 A1 | 8/2016 | Kannan et al. |
| 2017/0018534 A1 | 1/2017 | Miki |
| 2017/0155004 A1 | 6/2017 | Phoa et al. |
| 2018/0037028 A1 | 2/2018 | Kobayashi |
| 2018/0366456 A1* | 12/2018 | Jeong .................. H01L 24/17 |
| 2018/0376582 A1 | 12/2018 | Chang et al. |
| 2021/0159178 A1* | 5/2021 | Nam .................. H01L 24/14 |
| 2021/0175161 A1 | 6/2021 | Park et al. |
| 2021/0249503 A1 | 8/2021 | Schmidt et al. |
| 2021/0265373 A1 | 8/2021 | Kang et al. |
| 2021/0408493 A1 | 12/2021 | Shen et al. |
| 2022/0013499 A1 | 1/2022 | Eom et al. |
| 2022/0037300 A1 | 2/2022 | Nakamura |
| 2022/0069186 A1 | 3/2022 | Iguchi et al. |
| 2022/0084968 A1 | 3/2022 | Son et al. |
| 2022/0130799 A1 | 4/2022 | Jang |

FOREIGN PATENT DOCUMENTS

| | | |
|---|---|---|
| JP | 2014003081 A | 1/2014 |
| KR | 1020170023643 A | 3/2017 |
| KR | 1020170094026 A | 8/2017 |
| KR | 1020200047930 A | 5/2020 |
| KR | 1020200113788 A | 10/2020 |

* cited by examiner

SEMICONDUCTOR CHIP INCLUDING THROUGH ELECTRODE, AND SEMICONDUCTOR PACKAGE INCLUDING THE SAME

CROSS-REFERENCE TO RELATED APPLICATION

This application is a continuation application of U.S. patent application Ser. No. 18/489,557, filed on Oct. 18, 2023, which is a continuation application of U.S. patent application Ser. No. 18/103,346, filed on Jan. 30, 2023, which is a continuation application of U.S. patent application Ser. No. 17/191,287, filed on Mar. 3, 2021, and claims priority under 35 U.S.C. § 119(a) to Korean Patent Application No. 10-2020-0159887 filed on Nov. 25, 2020, in the Korean Intellectual Property Office, which are incorporated herein by reference in their entirety.

BACKGROUND

1. Technical Field

This patent document relates to a semiconductor technology, and more particularly, to a semiconductor chip including a through electrode, and a semiconductor package including the semiconductor chip.

2. Related Art

Electronic products require high-volume data processing while their sizes are getting smaller. Accordingly, semiconductor chips used in such electronic products are also required to have a thin thickness and a small size. Further, a semiconductor package in which a plurality of semiconductor chips are embedded has been manufactured.

The plurality of semiconductor chips may be stacked in a vertical direction, and be electrically connected to each other by a through via passing through each semiconductor chip.

SUMMARY

In an embodiment, a semiconductor chip may include: a body portion with a front surface and a rear surface; an insulating layer disposed over the rear surface of the body portion; a pair of through electrodes penetrating the body portion and the insulating layer; and a rear connection electrode disposed over the insulating layer and connected simultaneously with the pair of through electrodes, wherein a distance between the pair of through electrodes is greater than twice a thickness of the insulating layer.

In another embodiment, a semiconductor chip may include: a body portion with a front surface and a rear surface; an insulating layer disposed over the rear surface of the body portion; a pair of through electrodes penetrating the body portion and the insulating layer; a metal-containing thin film layer disposed over the insulating layer and connected simultaneously with the pair of through electrodes; and a rear connection electrode disposed over the metal-containing thin film layer and connected to the metal-containing thin film layer, wherein the metal-containing thin film layer includes an undercut that is formed under a sidewall of the rear connection electrode due to the metal-containing thin film layer being recessed, and wherein a width of the rear connection electrode is equal to or greater than a sum of widths of the pair of through electrodes, a distance between the pair of through electrodes, and a width of the undercut.

In another embodiment, a semiconductor package may include: first and second semiconductor chips that are stacked in a vertical direction, and each of the first and second semiconductor chips comprises: a body portion with a front surface and a rear surface; an insulating layer disposed over the rear surface of the body portion; a pair of through electrodes penetrating the body portion and the insulating layer; a rear connection electrode disposed over the insulating layer and connected simultaneously with the pair of through electrodes; a wiring portion disposed over the front surface of the body portion; and a front connection electrode disposed over the wiring portion, wherein the rear connection electrode of the first semiconductor chip is connected to the front connection electrode of the second semiconductor chip, and wherein a distance between the pair of through electrodes is greater than twice a thickness of the insulating layer.

DETAILED DESCRIPTION

Figure 1:
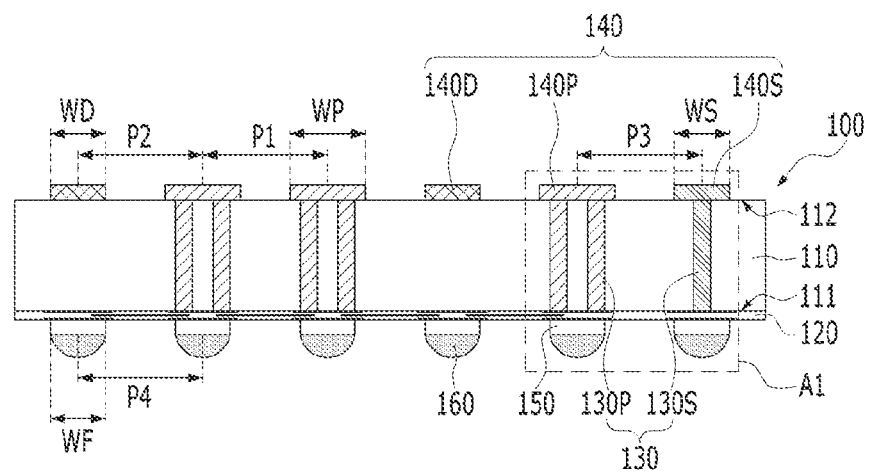
FIG. 1 is a cross-sectional view illustrating a semiconductor chip according to an embodiment of the present disclosure.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description with two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

FIG. 1 is a cross-sectional view illustrating a semiconductor chip according to an embodiment of the present disclosure.

Referring to FIG. 1, a semiconductor chip 100 of the present embodiment may include a body portion 110, a wiring portion 120, a through electrode 130, a rear connection electrode 140, a front connection electrode 150, and a bonding layer 160.

The body portion 110 may be formed of a semiconductor material, such as silicon or germanium, and may have a front surface 111, a rear surface 112, and a side surface that connects them to each other. The front surface 111 of the body portion 110 may refer to an active surface on which the wiring portion 120 is disposed, and the rear surface 112 of the body portion 110 may refer to a surface that is located on the opposite side of the front surface 111.

The wiring portion 120 may be formed over the front surface 111 of the body portion 110. The wiring portion 120 may include a circuit/wiring structure electrically connected to the through electrode 130. For convenience of description, the circuit/wiring structure is simply illustrated as lines in the wiring portion 120, but is not limited thereto. In this case, the circuit/wiring structure may be implemented in various ways based on the type of the semiconductor chip 100. For example, when the semiconductor chip 100 includes volatile memory, such as DRAM (Dynamic Random Access Memory) or SRAM (Static RAM), or non-volatile memory, such as NAND flash, RRAM (Resistive RAM), PRAM (Phase-change RAM), MRAM (Magneto-resistive RAM), or FRAM (Ferroelectric RAM), the circuit/wiring structure may include a memory cell array with a plurality of memory cells.

The through electrode 130 may be formed in the body portion 110. The through electrode 130 may have a pillar shape extending from the front surface 111 to the rear surface 112 to penetrate the body portion 110. As an example, the through electrode 130 may be a TSV (Through Silicon Via). The through electrode 130 may include various conductive materials. As an example, the through electrode 130 may include a metal, such as copper (Cu), tin (Sn), silver (Ag), tungsten (W), nickel (Ni), ruthenium (Ru), or cobalt (Co), or a compound of this metal. One end of the through electrode 130 may be connected to a part of the wiring portion 120, and the other end of the through electrode 130 may be connected to the rear connection electrode 140.

In this case, the through electrode 130 may include a signal through electrode 130S that transmits a signal and a power through electrode 130P for supplying power. The signal may include various signals that are required for driving the semiconductor chip 100. As an example, when the semiconductor chip 100 includes memory, signals (such as a data input/output signal (DQ), a command/address signal (CA), or a chip selection signal (CS)) may move through the signal through electrode 130S. Also, the power may include various levels of power voltages or a ground voltage required that drive the semiconductor chip 100. In the present embodiment, one signal through electrode 130S and six power through electrodes 130P are illustrated, but the present disclosure is not limited thereto, and the number of the signal through electrodes 130S and the number of the power through electrodes 130P may be varied. In a horizontal direction, that is, in a direction that is parallel to the front surface 111 and the rear surface 112 of the body portion 110, the width of the through electrodes 130 may be constant. That is, the width of each signal through electrode 130S and the width of each power through electrode 130P may be the same. For example, when the through electrode 130 has a cylindrical shape, the cross-sectional diameter of the signal through electrode 130S and the cross-sectional diameter of the power through electrode 130P may be substantially the same.

The rear connection electrode 140 may be formed over the rear surface 112 of the body portion 110. The rear connection electrode 140 may connect the through electrode 130 to another component, for example, another semiconductor chip to be located over the rear surface 112 of the semiconductor chip 100. As an example, the rear connection electrode 140 may include a conductive bump. The rear connection electrode 140 may include various metal materials, such as copper, nickel, or a combination thereof, and may have a single-layered structure or a multi-layered structure.

The rear connection electrode 140 may include a signal rear connection electrode 140S that is connected to the signal through electrode 130S, a power rear connection electrode 140P that is connected to the power through electrode 130P, and a dummy rear connection electrode 140D that is not connected to the through electrode 130.

The signal rear connection electrode 140S may be formed to overlap and connect with each signal through electrode 130S. One signal rear connection electrode 140S and one signal through electrodes 130S may correspond to each other.

The power rear connection electrode 140P may be formed to simultaneously connect with a pair of power through electrodes 130P. That is, one power rear connection electrode 140P and two power through electrodes 130P may correspond to each other. The pair of power through electrodes 130P may be spaced apart from each other with a part of the body portion 110 therebetween.

The dummy rear connection electrode 140D may be in an electrically floating state. The dummy rear connection electrode 140D may function to maintain process stability in a process of stacking a plurality of semiconductor chips (to be described later) and to improve heat dissipation characteristics in a semiconductor package with the plurality of stacked semiconductor chips. This will be described in more detail in the relevant section. If necessary, the dummy rear connection electrode 140D may be omitted.

The front connection electrode 150 may be formed over the wiring portion 120. The front connection electrode 150 may electrical connect with another component, for example, another semiconductor chip or a substrate to be positioned over the front surface 111 of the semiconductor chip 100. The front connection electrode 150 may include a conductive bump. The front connection electrode 150 may include various metal materials, such as copper, nickel, or a combination thereof, and may have a single-layered structure or a multi-layered structure.

The front connection electrode 150 may be electrically connected to the wiring portion 120. Furthermore, the front connection electrode 150 may be electrically connected to the through electrode 130 through the wiring portion 120. That is, unlike the rear connection electrode 140, the front connection electrode 150 might not directly contact the through electrode 130.

The bonding layer 160 may be formed over a surface of the front connection electrode 150, which is located on the opposite side of the surface that is in contact with the wiring portion 120. When a plurality of semiconductor chips 100 are stacked in a vertical direction, that is, in a direction perpendicular to the front surface 111 and the rear surface 112 of the body portion 110, the bonding layer 160 may be bonded to the rear connection electrode 140. The bonding layer 160 may include a solder material with a hemispherical shape, a ball shape, or a shape similar thereto. However, the present embodiment is not limited thereto, and the shape and material of the bonding layer 160 may be variously modified.

In the horizontal direction, the width of the signal rear connection electrode 140S, the width of the power rear connection electrode 140P, the width of the dummy rear connection electrode 140D, and the width of the front connection electrode 150 are denoted by reference numerals WS, WP, WD, and WF, respectively. The width WS of the signal rear connection electrode 140S may be greater than or equal to the width of the signal through electrode 130S. The width WS of the signal rear connection electrode 140S, the width WD of the dummy rear connection electrode 140D, and the width WF of the front connection electrode 150 may be the same. On the other hand, the width WP of the power rear connection electrode 140P may be greater than the width WS of the signal rear connection electrode 140S, the width WD of the dummy rear connection electrode 140D, and the width WF of the front connection electrode 150. This is because the width WP of the power rear connection electrode 140P must be large enough to overlap with the pair of power through electrodes 130P and a space therebetween, whereas there is no such restriction on the width WS of the signal rear connection electrode 140S, the width WD of the dummy rear connection electrode 140D, and the width WF of the front connection electrode 150. However, the present disclosure is not limited thereto, and the width/size of the connection electrodes 140P, 140D, 140S, and 150 may be modified in various ways.

Despite the difference in width/size of the signal rear connection electrode 140S, the power rear connection electrode 140P, and the dummy rear connection electrode 140D, the pitch of the rear connection electrodes 140, that is, the distance between the center of any one of the rear connection electrodes 140 and the center of the adjacent rear connection electrode 140 may be substantially constant. For example, as shown, a pitch P1 between two adjacent power rear connection electrodes 140P, a pitch P2 between the power rear connection electrode 140P and the dummy rear connection electrode 140D that are adjacent to each other, and a pitch P3 between the power rear connection electrode 140P and the signal rear connection electrode 140S that are adjacent to each other, may have a fixed value. Furthermore, the pitch P4 of the front connection electrodes 150 may also be substantially the same as the pitch of the rear connection electrodes 140.

According to the semiconductor chip 100 described above, because one power rear connection electrode 140P is in contact with the pair of power through electrodes 130P at the same time, it may be possible to reduce the resistance of the power supply path through the power rear connection electrode 140P and the pair of power through electrodes 130P. As a result, power may be easily and stably supplied.

FIGS. 2A to 2G are cross-sectional views illustrating a method for fabricating a semiconductor chip according to an embodiment of the present disclosure. For convenience of description, these cross-sectional views are shown based on a part of the semiconductor chip of FIG. 1 (see A1).

Figure 2A:
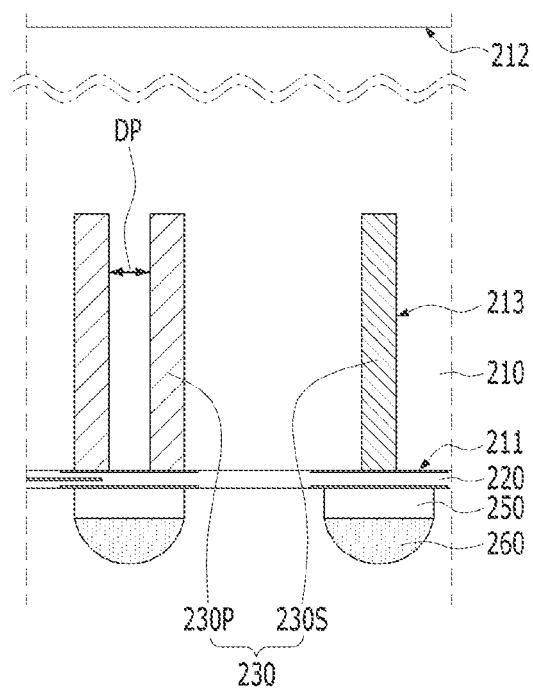
FIGS. 2A to 2G are cross-sectional views illustrating a method for fabricating a semiconductor chip according to an embodiment of the present disclosure.

Referring to FIG. 2A, a structure with an initial body portion 210 that has a front surface 211 and an initial rear surface 212 and has an initial through electrode 230 formed therein, a wiring portion 220 that is disposed over the front surface 211 of the initial body portion 210, and a front connection electrode 250 and a bonding layer 260 that are disposed over the wiring portion 220, may be formed over a carrier substrate (not shown). This structure may be attached to the carrier substrate by using an adhesive material. The method of forming this structure will be described in more detail below.

First, the initial body portion 210 with the front surface 211 and the initial rear surface 212 may be provided. The initial rear surface 212 may have a greater distance from the front surface 211 than the rear surface 112 of FIG. 1, and accordingly, the initial body portion 210 may have a greater thickness than the body portion 110 of FIG. 1.

Subsequently, the initial body portion 210 may be etched to form a hole 213 in the initial body portion 210. The hole 213 may be formed to a predetermined depth from the front surface 211 of the initial body portion 210 toward the initial rear surface 212. The depth of the hole 213 may be smaller than the thickness of the initial body portion 210.

Subsequently, the hole 213 may be filled with a conductive material to form the initial through electrode 230. The initial through electrode 230 may include an initial power through electrode 230P and an initial signal through electrode 230S. At this time, a distance DP between a pair of initial power through electrodes 230P to be connected to one power rear connection electrode may be determined based on the thickness of the initial insulating layer (see 280 in FIG. 2C) and/or the insulating layer (see 280A in FIG. 2E). This will be described in more detail in the relevant section.

Subsequently, the wiring portion 220 may be formed over the front surface 211 of the initial body portion 210 in which the initial through electrode 230 is formed, and then, the front connection electrode 250 and the bonding layer 260 may be formed over the wiring portion 220. Accordingly, the structure that is disposed over the carrier substrate may be obtained.

Figure 2B:
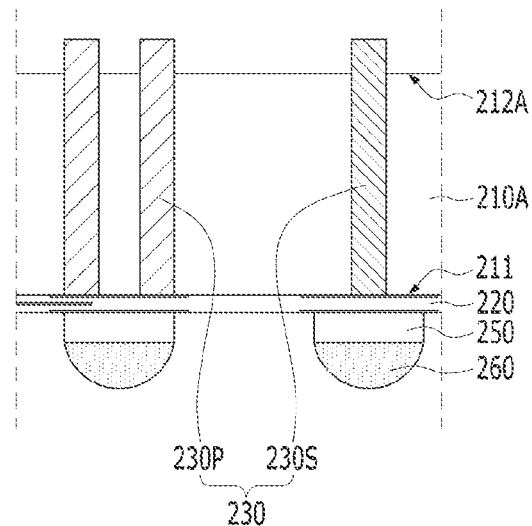

Referring to FIG. 2B, a portion of the initial body portion 210 may be removed to form a body portion 210A whose thickness is smaller than that of the initial body portion 210. That is, a process of thinning the initial body portion 210 may be performed.

The thinning process may be performed on the initial rear surface 212 of the initial body portion 210. Accordingly, the body portion 210A may have the front surface 211 and a rear surface 212A. The distance between the rear surface 212A and the front surface 211 may be shorter than the distance between the initial rear surface 212 and the front surface 211. Further, the thinning process may be performed through grinding, chemical mechanical polishing (CMP), and/or etch-back. Further, the thinning process may be performed so that a part of the initial through electrode 230 protrudes from the rear surface 212A of the body portion 210A.

Figure 2C:
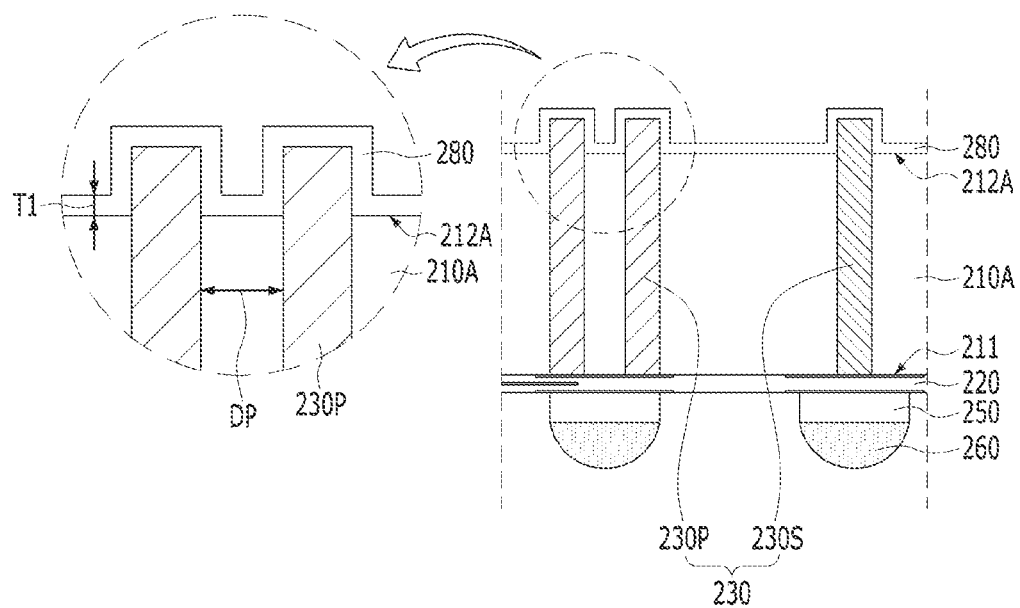

Referring to FIG. 2C, an initial insulating layer 280 may be formed over the rear surface 212A of the body portion 210A and the part of the initial through electrode 230 that protrudes from the rear surface 212A of the body portion 210A.

The initial insulating layer 280 may be transformed into an insulating layer (see 280A in FIG. 2E) through a planarization process that will be described later, and this insulating layer may function to protect the semiconductor chip and prevent current leakage due to metal diffusion between the through electrodes. This will be described in more detail in the relevant section.

The initial insulating layer 280 may be formed by various deposition methods, such as chemical vapor deposition (CVD), physical vapor deposition (PVD), or atomic layer deposition (ALD). The initial insulating layer 280 may include silicon oxide, silicon nitride, silicon oxynitride, or a combination thereof. In addition, in the present embodiment, the initial insulating layer 280 may have a single-layered structure, but the present disclosure is not limited thereto. In another embodiment, the initial insulating layer 280 may have a multi-layered structure.

The initial insulating layer 280 may be formed to have a substantially uniform thickness along its lower profile. The thickness of the initial insulating layer 280 is denoted by reference numeral T1. In this case, the distance DP between the pair of initial power through electrodes 230P may have a value that is greater than twice the thickness T1 of the initial insulating layer 280. This is to secure a space in which the initial insulating layer 280 may be formed between portions of the pair of initial power through electrodes 230P, which protrude from the rear surface 212A of the body portion 210A. This will be described in more detail compared to FIG. 2H.

Figure 2D:
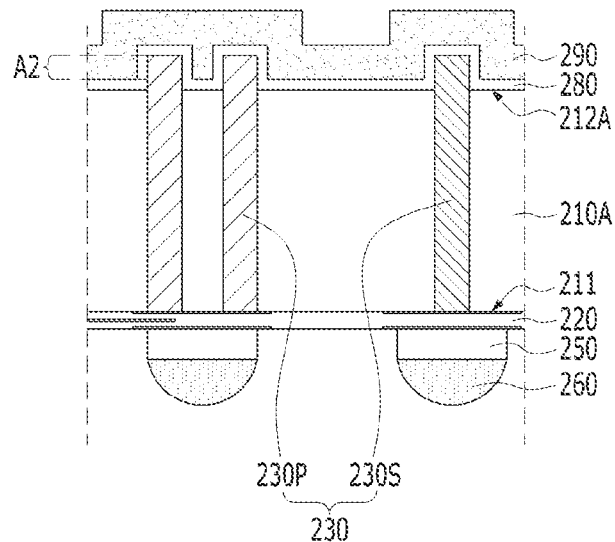
Figure 2E:
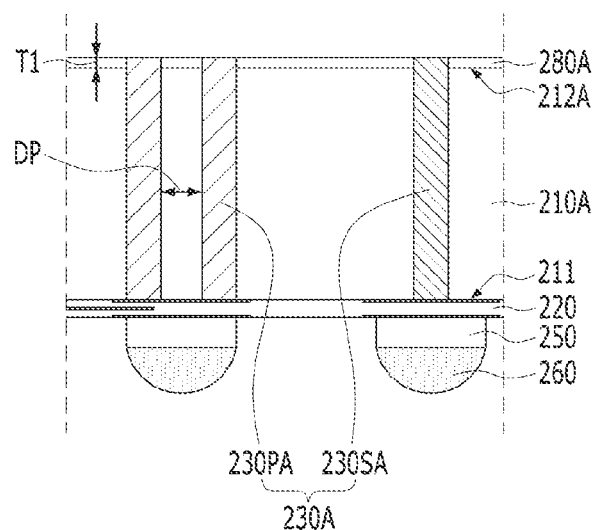
Figure 2F:
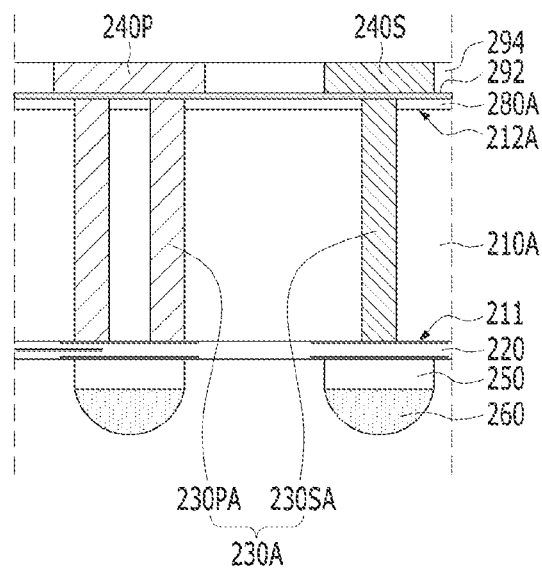
Figure 2G:
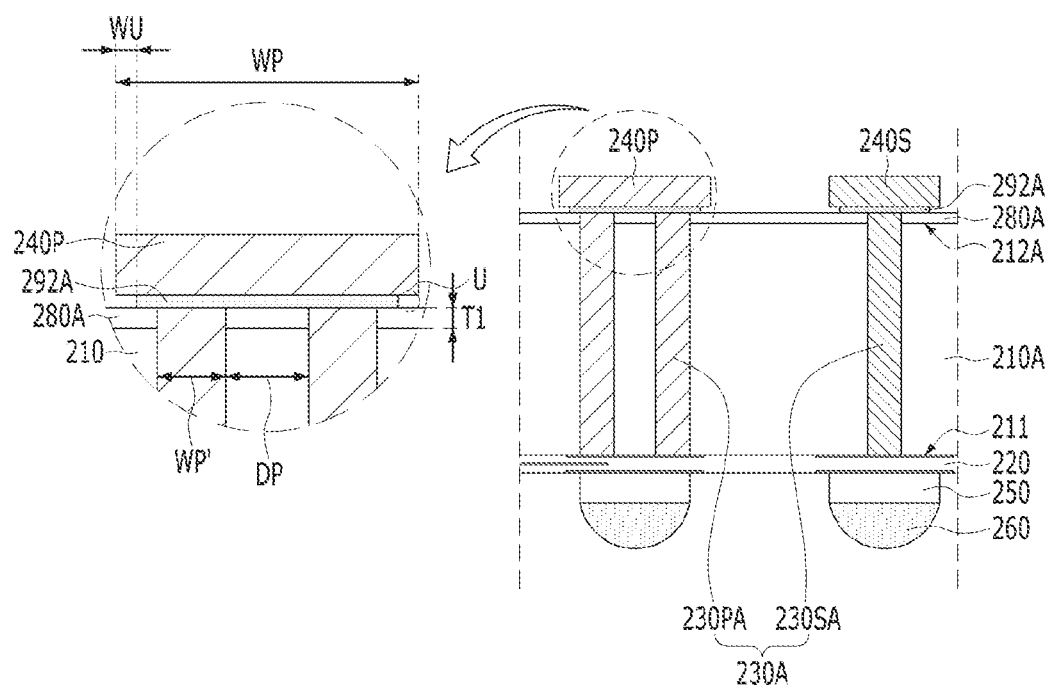
Figure 2H:
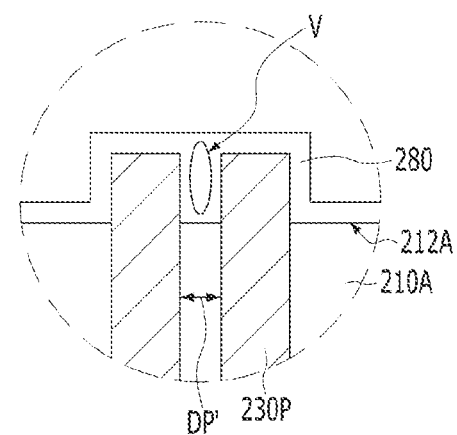
FIG. 2H is a view for comparison with FIG. 2C.

FIG. 2H is a view for comparison with FIG. 2C. FIG. 2H shows a case in which a distance DP' between the pair of initial power through electrodes 230P is shorter than the distance DP shown in FIG. 2C, that is, the distance DP' is less than twice the thickness T1 of the initial insulating layer 280.

Referring to FIG. 2H, when the distance DP' between the pair of initial power through electrodes 230P is relatively narrow, the initial insulating layer 280 might not be deposited to a desired thickness between the pair of initial power through electrodes 230P. This is because the upper portion of the space between the portions of the pair of initial power through electrodes 230P, which protrudes over the rear surface 212A of the body portion 210A, is blocked with an insulating material for forming the initial insulating layer 280, before the initial insulating layer 280 is deposited to a desired thickness, and as a result, an unwanted void V are generated in the initial insulating layer 280 that is formed in this space.

In this case, when the planarization process (described later) is performed, a problem may occur in which an insulating layer to be formed on the rear surface 212A of the body portion 210A between a pair of power through electrodes (see 230PA in FIG. 2E) is absent or is thinner than a desired thickness.

Referring back to FIG. 2C, in the present embodiment, in order to solve the problem described in FIG. 2H, the distance DP between the pair of initial power through electrodes 230P may be set to have a value that is greater than twice the thickness T1 of the initial insulating layer 280.

Referring to FIG. 2D, a sacrificial layer 290 may be formed over the initial insulating layer 280.

The sacrificial layer 290 may prevent process defects from occurring during the planarization process, which will be described later. If the planarization process is performed on the resultant structure of FIG. 2C without the sacrificial layer 290, pressure may be concentrated on the protruding portion of the initial through electrode 230, and thus, the protruding portion may break. The broken portion as a conductive material may cause various defects within the semiconductor chip. The sacrificial layer 290 may prevent concentration of such pressure. The sacrificial layer 290 may be formed to have a thickness that sufficiently covers the protruding portion of the initial through electrode 230.

Referring to FIG. 2E, the planarization process may be performed on the resultant structure of FIG. 2D. The planarization process may be performed by a polishing method, such as chemical mechanical polishing.

In this case, the planarization process may be performed until the initial insulating layer 280 that is formed over the rear surface 212A of the body portion 210A is exposed. As a result, substantially all of the sacrificial layer 290 may be removed in the planarization process. In addition, a portion of the initial through electrode 230 (see A2 in FIG. 2D), which is positioned above the upper surface of the initial insulating layer 280 that is formed over the rear surface 212A of the body portion 210A, may be removed to form a through electrode 230A. Further, a portion of the initial insulating layer 280, which is formed along the side and upper surfaces of the portion of the initial through electrode 230 (see A2 in FIG. 2D), may also be removed to form an insulating layer 280A.

As a result, the insulating layer 280A may be formed over the rear surface 212A of the body portion 210A, and the through electrode 230A that penetrates the insulating layer 280A and the body portion 210A may be formed. The through electrode 230A may include a signal through electrode 230SA and a power through electrode 230PA. One end of the through electrode 230A may be electrically connected to the wiring portion 220 as described above, and the other end and/or the upper surface of the through electrode 230A may form a flat surface with the upper surface of the insulating layer 280A while being exposed from the insulating layer 280A.

Meanwhile, the planarization process may be performed by using the upper surface of the initial insulating layer 280 that is formed over the rear surface 212A of the body portion 210A as a planarization stop layer, for example, a polishing stop layer. Therefore, during this planarization process, it may be assumed that there is little loss in the initial insulating layer 280 that is formed over the rear surface 212A of the body portion 210A, or the loss is negligible even if the loss exists. Accordingly, the thickness of the insulating layer 280A is denoted by reference numeral T1 that is equal to the thickness of the initial insulating layer 280.

Referring to FIG. 2F, an initial metal-containing thin film layer 292 may be formed over the insulating layer 280A. The initial metal-containing thin film layer 292 may include a metal, such as copper (Cu) or titanium (Ti), or a compound of this metal, and may have a single-layered structure or a multi-layered structure. As an example, the initial metal-containing thin film layer 292 may have a multi-layered structure with a barrier layer and a seed layer that is disposed over the barrier layer. The barrier layer may include a metal or a metal compound, such as Ti, TiW, TiN, or NiV, and the seed layer may include a metal, such as Cu. In this case, the barrier layer may serve to prevent metal diffusion between the through electrodes 230A, and the seed layer may function as a seed during subsequent electroplating.

Subsequently, a photoresist pattern 294 that provides spaces in which a power rear connection electrode 240P and a signal rear connection electrode 240S are to be formed, may be formed over the initial metal-containing thin film layer 292, and then, electroplating may be performed. As a result, the power rear connection electrode 240P and the signal rear connection electrode 240S may be formed in the spaces that are provided by the photoresist pattern 294. The power rear connection electrode 240P may be connected to a pair of power through electrodes 230PA, and the signal rear connection electrode 240S may be connected to one signal through electrode 230SA. For reference, although not shown in this figure, a dummy rear connection electrode (see 140D of FIG. 1) that is not connected to the through electrode 230A may also be formed in this process.

Referring to FIG. 2G, after removing the photoresist pattern (294 of FIG. 2F), a portion of the initial metal-containing thin film layer 292, which is not covered by the power rear connection electrode 240P and the signal rear connection electrode 240S, may be removed. As a result, a metal-containing thin film layer 292A may be formed. The metal-containing thin film layer 292A may be disposed under each of the power rear connection electrode 240P and the signal rear connection electrode 240S, and may be connected to each of the power rear connection electrode 240P and the signal rear connection electrode 240S. In particular, the metal-containing thin film layer 292A under the power rear connection electrode 240P may be connected to the pair of power through electrodes 230PA at the same time.

In this case, the portion of the initial metal-containing thin film layer 292 may be removed by an isotropic etching method, such as wet etching. Accordingly, the metal-containing thin film layer 292A may have a side surface that is recessed inward in comparison to the side surface of each of the power rear connection electrode 240P and the signal rear connection electrode 240S. The space that is formed under each of the power rear connection electrode 240P and the signal rear connection electrode 240S by the recessed side surface of the metal-containing thin film layer 292A will be hereinafter referred to as an undercut U of the metal-containing thin film layer 292A.

In this case, the width WP of the power rear connection electrode 240P may have a value that is equal to or greater than the sum of the widths WP' of the pair of power through electrodes 230PA, the distance DP between the pair of power through electrodes 230PA, and the width WU of the undercut U.

Meanwhile, even if the undercut U is formed, the pair of power through electrodes 230PA might not be exposed through the undercut U. The upper surfaces of the pair of power through electrodes 230PA may be completely covered by the metal-containing thin film layer 292A. To this end, the side surface of the metal-containing thin film layer 292A may be located farther from the center of the power rear connection electrode 240P than the side surfaces of each of the pair of power through electrodes 230PA.

As a result, a semiconductor chip as shown in FIG. 2G may be fabricated. The semiconductor chip of FIG. 2G may be substantially the same as the semiconductor chip of FIG. 1. In the semiconductor chip of FIG. 2G, the body portion 210A, the wiring portion 220, the through electrode 230A with the power through electrode 230PA and the signal through electrode 230SA, the power rear connection electrode 240P, the signal rear connection electrode 240S, the front connection electrode 250, and the bonding layer 260 may correspond to the body portion 110, the wiring portion 120, the through electrode 130 with the power through electrode 130P and the signal through electrode 130S, the power rear connection electrode 140P, the signal rear connection electrode 140S, the front connection electrode 150, and the bonding layer 160 of the semiconductor chip 100 of FIG. 1, respectively.

Further, the semiconductor chip of FIG. 2G may further include the insulating layer 280A that is disposed over the rear surface 212A of the body portion 210A. The through electrode 230A may be formed to penetrate the body portion 210A and the insulating layer 280A, and the power rear connection electrode 240P and the signal rear connection electrode 240S may be formed over the insulating layer 280A to be connected to the through electrode 230A. Further, the metal-containing thin film layer 292A with the undercut U may be further interposed between the power through electrode 230PA and the power rear connection electrode 240P, and between the signal through electrode 230SA and the signal rear connection electrode 240S.

Here, the distance DP between the pair of power through electrodes 230PA may be greater than twice the thickness T1 of the insulating layer 280A. In addition, the width WP of the power rear connection electrode 240P that is connected to the pair of power through electrodes 230PA may be equal to or greater than the sum of the widths WP' of the pair of power through electrodes 230PA, the distance DP between the pair of power through electrodes 230PA, and the width WU of the undercut U.

A detailed description of the components shown in FIG. 2G has already been described in the manufacturing method, and thus will be omitted.

Figure 3:
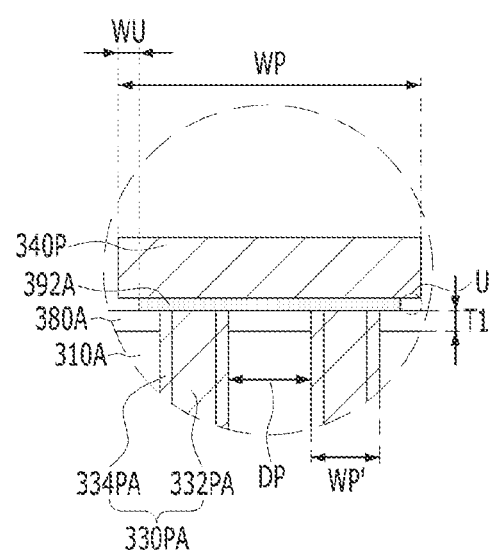
FIG. 3 is a cross-sectional view illustrating a semiconductor chip according to another embodiment of the present disclosure.

FIG. 3 is a cross-sectional view illustrating a semiconductor chip according to another embodiment of the present disclosure. For convenience of description, this cross-sectional view is shown based on an enlarged view of the semiconductor chip of FIG. 2G. Hereinafter, a description will be made focusing on the differences from FIG. 2G.

Referring to FIG. 3, in a semiconductor chip of the present embodiment, a power through electrode 330PA may include a conductive pillar 332PA and a spacer insulating layer 334PA that surround the sidewall of the conductive pillar 332PA. The conductive pillar 332PA may include a metal, such as copper (Cu), tin (Sn), silver (Ag), tungsten (W), nickel (Ni), ruthenium (Ru), or cobalt (Co), or a compound of this metal. The spacer insulating layer 334PA may be disposed between the conductive pillar 332PA and a body portion 310A to insulate them from each other. The spacer insulating layer 334PA may include an insulating material, such as silicon oxide, silicon nitride, or silicon oxynitride. Here, the width WP' of the power through electrode 330PA may mean the sum of the width of the conductive pillar 332PA and the width of the spacer insulating layer 334PA.

Reference numerals 380A, 392A, and 340P, which are not described, may denote an insulating layer, a metal-containing thin film layer, and a power rear connection electrode, respectively.

Further, although not shown, a signal through electrode may also have a structure in which a spacer insulating layer surrounds a sidewall of a conductive pillar.

Figure 4:
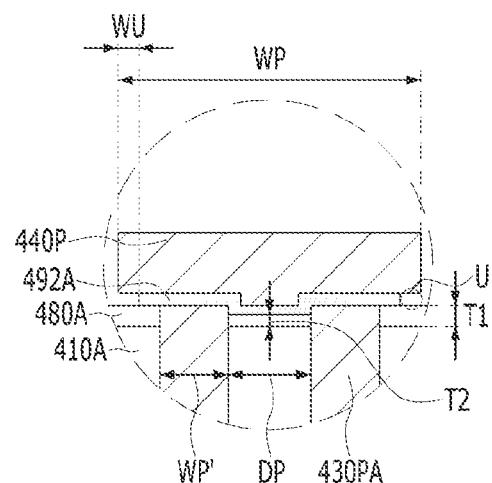
FIG. 4 is a cross-sectional view illustrating a semiconductor chip according to another embodiment of the present disclosure.

FIG. 4 is a cross-sectional view illustrating a semiconductor chip according to another embodiment of the present disclosure. For convenience of description, this cross-sectional view is shown based on an enlarged view of the semiconductor chip of FIG. 2G. Hereinafter, a description will be made focusing on differences from FIG. 2G.

Referring to FIG. 4, in a semiconductor chip of the present embodiment, the thickness T2 of an insulating layer 480A between a pair of power through electrodes 430PA may be smaller than the thickness T1 of the insulating layer 480A that is outside of the pair of power through electrodes 430PA. The reason is as follows.

The above-described planarization process (refer to FIG. 2E) may be performed to substantially maintain the thickness of the initial insulating layer, that is, to stop polishing when the upper surface of the initial insulating layer is exposed. In this case, in the process of exposing the whole upper surface of the initial insulating layer that is outside of the pair of power through electrodes 430PA with a relatively large area, the initial insulating layer between the pair of power through electrodes 430PA with a relatively narrow area may be over-polished. As a result, the insulating layer 480A with a thickness difference as illustrated may be obtained.

The metal-containing thin film layer 292A may be formed over the insulating layer 480A along the profile of the insulating layer 480A. Accordingly, a step height may occur in the metal-containing thin film layer 292A. That is, the metal-containing thin film layer 292A may have relatively low upper/lower surfaces between the pair of power through electrodes 430PA, while having relatively high upper/lower surfaces in the remaining regions.

Reference numerals 410A and 440P, which are not described, may denote a body portion and a power rear connection electrode, respectively.

Figure 5:
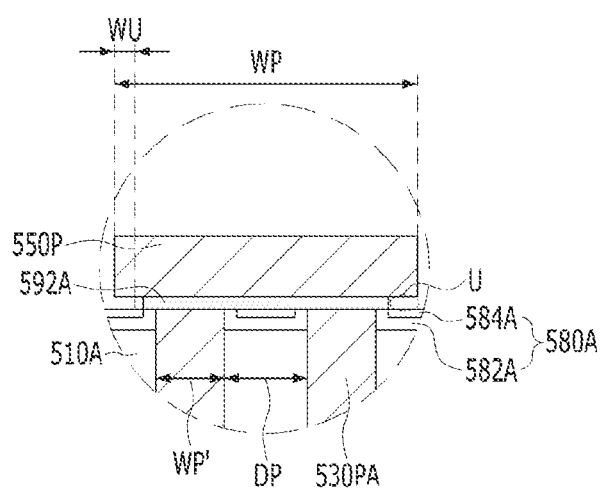
FIG. 5 is a cross-sectional view illustrating a semiconductor chip according to another embodiment of the present disclosure.

FIG. 5 is a cross-sectional view illustrating a semiconductor chip according to another embodiment of the present disclosure. For convenience of description, this cross-sectional view is shown based on an enlarged view of the semiconductor chip of FIG. 2G. Hereinafter, a description will be made focusing on differences from FIG. 2G.

Referring to FIG. 5, in a semiconductor chip of the present embodiment, an insulating layer 580A may have a multi-layered structure. For example, the insulating layer 580A may have a stacked structure of a first insulating layer 582A and a second insulating layer 584A.

In this case, the first insulating layer 582A may be formed along a rear surface of a body portion 510A and a side surface of a portion of a power through electrode 530PA, which protrudes from the rear surface of the body portion 510A. The second insulating layer 584A may be formed to fill a space that is defined by the first insulating layer 582A. Accordingly, the first insulating layer 582A may be interposed between the second insulating layer 584A and the power through electrode 530PA, and between the second insulating layer 584A and the rear surface of the body portion 510A.

The first insulating layer 582A and the second insulating layer 584A may be formed of different insulating materials. For example, when the first insulating layer 582A is silicon nitride, the second insulating layer 584A may be silicon oxide, and vice versa.

Reference numeral 550P, which is not described, may denote a power rear connection electrode.

Figure 6A:
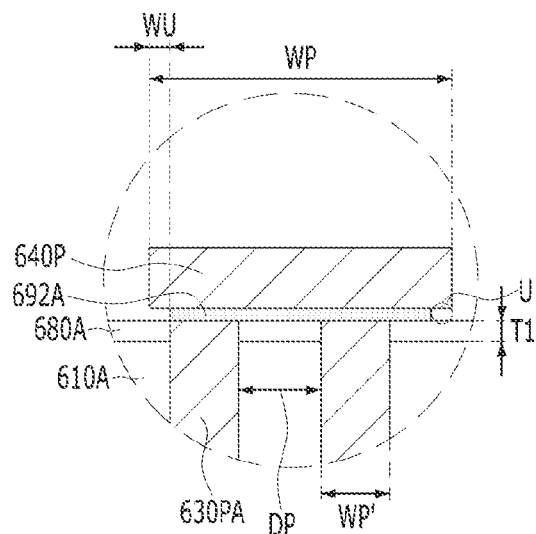
FIGS. 6A and 6B are cross-sectional views illustrating a semiconductor chip according to another embodiment of the present disclosure.
Figure 6B:
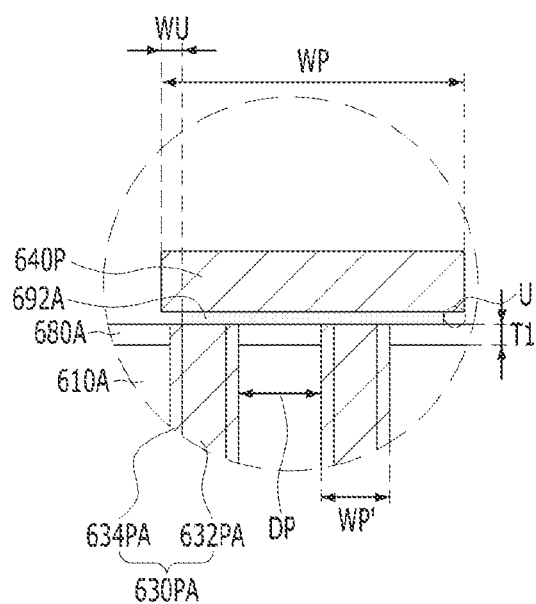

FIGS. 6A and 6B are cross-sectional views illustrating a semiconductor chip according to another embodiment of the present disclosure. For convenience of description, this cross-sectional view is shown based on an enlarged view of the semiconductor chip of FIG. 2G. Hereinafter, a description will be made focusing on differences from FIG. 2G.

Referring to FIG. 6A, in a semiconductor chip of the present embodiment, the positions of the metal-containing thin film layer 692A and the power rear connection electrode 640P may be moved. Even in this case, the power rear connection electrode 640P may be connected to a pair of power through electrodes 630PA at the same time, and the pair of power through electrodes 630PA might not be exposed. The metal-containing thin film layer 692A may cover the upper surfaces of the pair of power through electrodes 630PA to avoid unnecessary exposure, which prevents metal ions from moving through them, resulting in an electrical short.

To this end, even if the metal-containing thin film layer 692A is moved, it may move only until one sidewall of one of the pair of power through electrodes 630PA and one sidewall of the metal-containing thin film layer 692A are aligned. Otherwise, at least a portion of the power through electrode 630PA may be unnecessarily exposed, or the power rear connection electrode 640P might not be simultaneously connected to the pair of power through electrode 630PA.

Referring to FIG. 6B, in a semiconductor chip of the present embodiment, the power through electrode 630PA may include a conductive pillar 632PA and a spacer insulating layer 634PA that surround the sidewall of the conductive pillar 632PA.

In this case, the metal-containing thin film layer 692A may move until one sidewall of the conductive pillar 632PA and one sidewall of the metal-containing thin film layer 692A are aligned. The upper surface of the spacer insulating layer 634PA may be exposed by the metal-containing thin film layer 692A.

The semiconductor chips, described above, may be stacked in a vertical direction to be implemented as a single semiconductor package. This will be exemplarily described with reference to FIG. 7.

Figure 7:
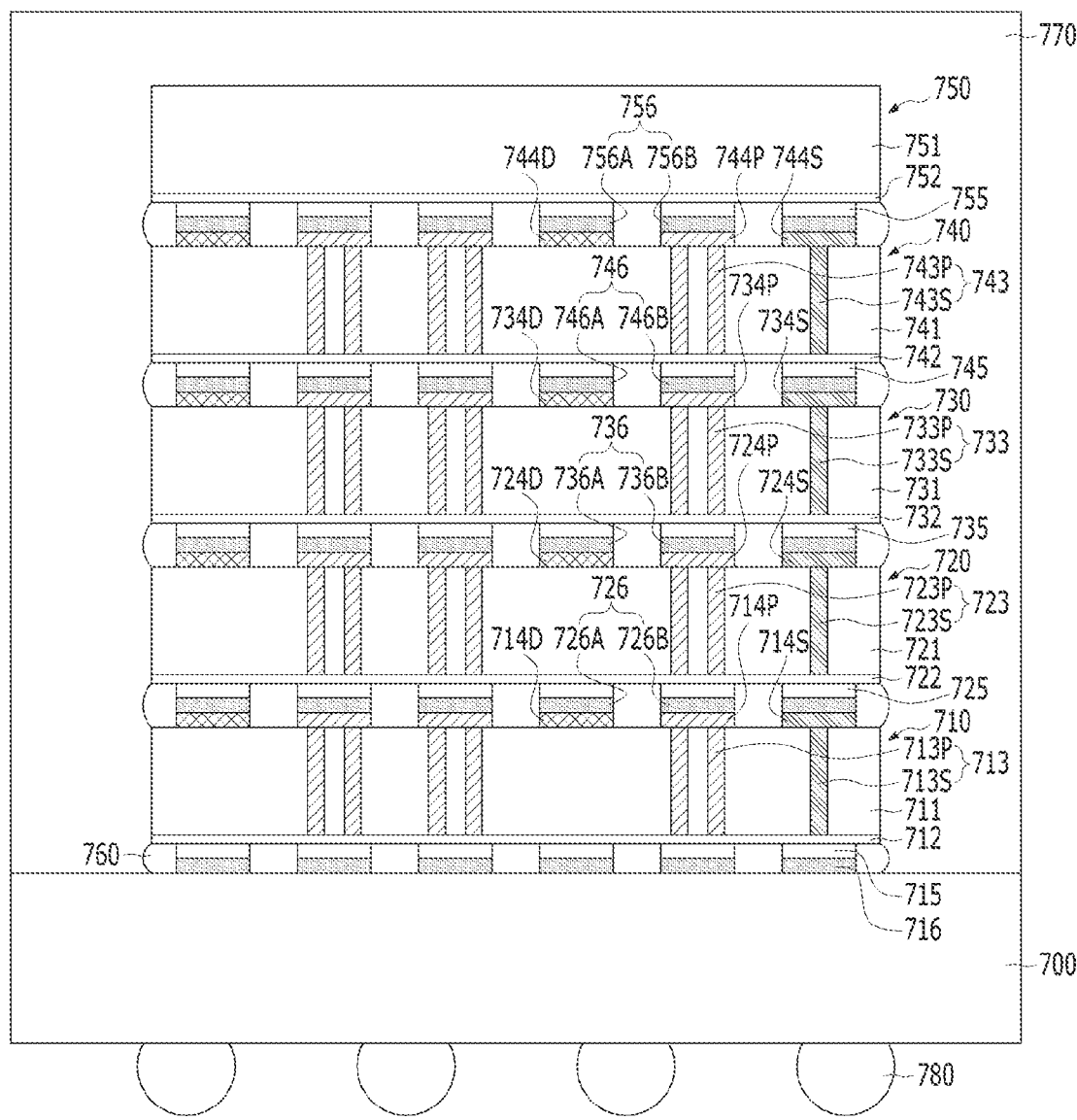
FIG. 7 is a cross-sectional view illustrating a semiconductor package according to an embodiment of the present disclosure.

FIG. 7 is a cross-sectional view illustrating a semiconductor package according to an embodiment of the present disclosure. The semiconductor package may include a plurality of semiconductor chips that are stacked in a vertical direction. Each of the plurality of semiconductor chips may include substantially the same semiconductor chip as one of the semiconductor chips of the above-described embodiments.

Referring to FIG. 7, a semiconductor package of the present embodiment may include a base layer 700 and a plurality of semiconductor chips 710, 720, 730, 740, and 750 that are stacked over the base layer 700 in the vertical direction. In the present embodiment, five semiconductor chips 710, 720, 730, 740, and 750 are stacked, but the present disclosure is not limited thereto, and the number of semiconductor chips that are stacked in the vertical direction may be modified in various ways. For convenience of description, the five semiconductor chips 710, 720, 730, 740, and 750 will be referred to as a first semiconductor chip 710, a second semiconductor chip 720, a third semiconductor chip 730, a fourth semiconductor chip 740, and a fifth semiconductor chip 750 based on the distance from the base layer 700.

The base layer 700 may be a layer with a circuit and/or wiring structure in order to connect a stacked structure of the plurality of semiconductor chips 710, 720, 730, 740, and 750 to an external component. For example, the base layer 700 may include a substrate, such as a printed circuit board (PCB), an interposer, a redistribution layer, or the like. Alternatively, when the plurality of semiconductor chips 710, 720, 730, 740, and 750 are memory chips, the base layer 700 may be a semiconductor chip with a logic circuit supporting operations of these memory chips, for example, a reading operation of reading data from the memory chips or a writing operation of writing data to the memory chips.

The base layer 700 may have an upper surface on which the plurality of semiconductor chips 710, 720, 730, 740, and 750 are disposed, and a lower surface on which an external connection terminal 780 for connecting the semiconductor package to an external component is disposed while being located on the opposite side of the upper surface.

Each of the first to fourth semiconductor chips 710, 720, 730, and 740, except for the fifth semiconductor chip 750 that is positioned at the uppermost portion of the first to fifth semiconductor chips 710, 720, 730, 740, and 750, may be substantially the same as one of the semiconductor chips of the above-described embodiments.

That is, the first semiconductor chip 710 may include a body portion 711 with front and rear surfaces, a wiring portion 712 that is disposed over the front surface of the body portion 711, a through electrode 713 that penetrates the body portion 711, a rear connection electrode 714 that is disposed over the rear surface of the body portion 711 and connected to the through electrode 713, a front connection electrode 715 that is disposed over the wiring portion 712, and a bonding layer 716 that is disposed over the front connection electrode 715. The through electrode 713 may include a signal through electrode 713S and a power through electrode 713P. The rear connection electrode 714 may include a signal rear connection electrode 714S, a power rear connection electrode 714P, and a dummy rear connection electrode 714D.

The second semiconductor chip 720 may include a body portion 721 with front and rear surfaces, a wiring portion 722 that is disposed over the front surface of the body portion 721, a through electrode 723 that penetrates the body portion 721, a rear connection electrode 724 that is disposed over the rear surface of the body portion 721 and connected to the through electrode 723, a front connection electrode 725 that is disposed over the wiring portion 722, and a bonding layer 726 that is disposed over the front connection electrode 725. The through electrode 723 may include a signal through electrode 723S and a power through electrode 723P. The rear connection electrode 724 may include a signal rear connection electrode 724S, a power rear connection electrode 724P, and a dummy rear connection electrode 724D. The bonding layer 726 may be bonded to the rear connection electrode 714 of the first semiconductor chip 710.

Because each of the third semiconductor chip 730 and the fourth semiconductor chip 740 has the same structure as the second semiconductor chip 720, detailed descriptions thereof will be omitted. The third semiconductor chip 730 may include a body portion 731, a wiring portion 732, a through electrode 733 with a signal through electrode 733S and a power through electrode 733P, a rear connection electrode 734 with a signal rear connection electrode 734S, a power rear connection electrode 734P, and a dummy rear connection electrode 734D, a front connection electrode 735, and a bonding layer 736. The fourth semiconductor chip 740 may include a body portion 741, a wiring portion 742, a through electrode 743 with a signal through electrode 743S and a power through electrode 743P, a rear connection electrode 744 with a signal rear connection electrode 744S, a power rear connection electrode 744P, and a dummy rear connection electrode 744D, a front connection electrode 745, and a bonding layer 746.

Because the fifth semiconductor chip 750 is located at the uppermost portion, it might not include a through electrode and a rear connection electrode. That is, as shown, the fifth semiconductor chip 750 may include a body portion 751 with front and rear surfaces, a wiring portion 752 that is disposed over the front surface of the body portion 751, a front connection electrode 755 that is disposed over the wiring portion 752, and a bonding layer 756 that is disposed over the front connection electrode 755.

In the present embodiment, the front connection electrodes 715, 725, 735, 745, and 755 and the rear connection electrodes 714, 724, 734, and 744 in the first to fifth semiconductor chips 710, 720, 730, 740, and 750 may have the same size. However, as opposed to what is shown, the sizes of the front connection electrodes 715, 725, 735, 745, and 755 and the rear connection electrodes 714, 724, 734, and 744 may be adjusted similarly to FIG. 1.

Spaces between the first semiconductor chip 710 and the base layer 700, between the first semiconductor chip 710 and the second semiconductor chip 720, between the second semiconductor chip 720 and the third semiconductor chip 730, between the third semiconductor chip 730 and the fourth semiconductor chip 740, and between the fourth semiconductor chip 740 and the fifth semiconductor chip 750, may be filled with a filling material 760. The filling material 760 may be formed by flowing an underfill material into the spaces through a capillary phenomenon and then curing.

Further, the base layer 700 and the first to fifth semiconductor chips 710, 720, 730, 740, and 750 may be surrounded by a molding layer 770. That is, the molding layer 770 may be formed to cover the first to fifth semiconductor chips 710, 720, 730, 740, and 750 over the upper surface of the base layer 700. The molding layer 770 may include various molding materials, such as EMC (Epoxy Mold Compound). As an example, when the filling material 760 is omitted, the molding layer 770 may be formed to fill the spaces between the first semiconductor chip 710 and the base layer 700, between the first semiconductor chip 710 and the second semiconductor chip 720, between the second semiconductor chip 720 and the third semiconductor chip 730, between the third semiconductor chip 730 and the fourth semiconductor chip 740, and between the fourth semiconductor chip 740 and the fifth semiconductor chip 750.

According to the semiconductor package of the present embodiment, a highly integrated semiconductor package may be implemented. In addition, it may be easy to supply power to the plurality of semiconductor chips 710, 720, 730, 740, and 750 stacked in the vertical direction.

According to the above embodiments of the present disclosure, it may be possible to provide a semiconductor chip with a through electrode, and a semiconductor package with the semiconductor chip, which are capable of enhancing operation characteristics and improving the process margins.

Figure 8:
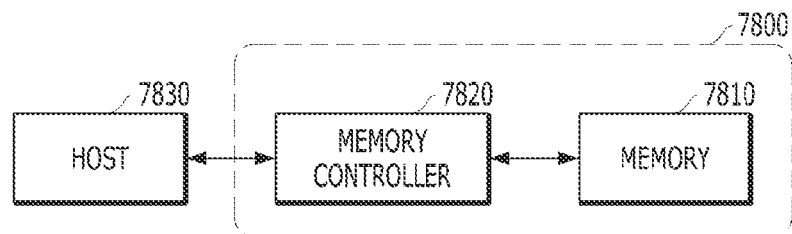
FIG. 8 shows a block diagram illustrating an electronic system employing a memory card including a semiconductor package according to an embodiment.

FIG. 8 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 9:
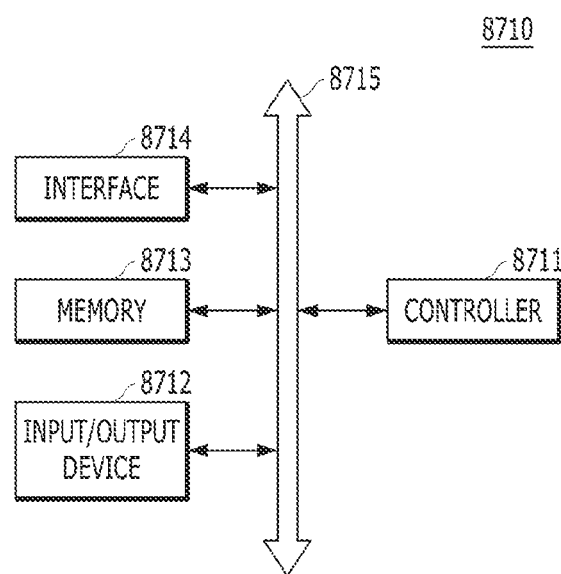
FIG. 9 shows a block diagram illustrating another electronic system including a semiconductor package according to an embodiment.

FIG. 9 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, it will be apparent to those skilled in the art that various changes and modifications may be made without departing from the spirit and scope of the present teachings as defined in the following claims.

What is claimed is:

1. A semiconductor package comprising:
  a first semiconductor chip; and
  a second semiconductor chip and a third semiconductor chip sequentially stacked over the first semiconductor chip,
  wherein the first semiconductor chip comprises:
  a first body with a first front surface;
  a first signal through electrode in the first body;
  a pair of first power through electrodes in the first body;
  a first signal front connection electrode electrically connected with the first signal through electrode, wherein the first signal front connection electrode is disposed over the first front surface; and
  a first power front connection electrode electrically connected with the pair of first power through electrodes, wherein the first power front connection electrode is disposed over the first front surface,
  wherein the second semiconductor chip comprises:
  a second body with a second front surface;
  a second signal through electrode in the second body; and
  a pair of second power through electrodes in the second body,
  wherein the pair of first power through electrodes are electrically connected with the pair of second power through electrodes, and
  wherein the first semiconductor chip, the second semiconductor chip, and the third semiconductor chip have a same size.

2. The semiconductor package according to claim 1, further comprising:
  a molding layer cover the first semiconductor chip, the second semiconductor chip, and the third semiconductor chip.

3. The semiconductor package according to claim 2, wherein the molding layer fills:
  a first space between the first semiconductor chip and the second semiconductor chip, and
  a second space between the second semiconductor chip and the third semiconductor chip.

4. The semiconductor package according to claim 2, wherein the molding layer covers:
  a first sidewall of the first semiconductor chip,
  a second sidewall of the second semiconductor chip, and
  a third sidewall of the third semiconductor chip.

5. The semiconductor package according to claim 2, further comprising:
  a filling material fills:
  a first space between the first semiconductor chip and the second semiconductor chip, and
  a second space between the second semiconductor chip and the third semiconductor chip.

6. The semiconductor package according to claim 1,
  wherein the first semiconductor chip further comprises a first dummy rear connection electrode over a first rear surface of the first body,
  wherein the second semiconductor chip further comprises a second dummy front connection electrode over the second front surface of the second body, and
  wherein the first dummy rear connection electrode vertically overlaps with the second dummy front connection electrode.

7. The semiconductor package according to claim 6,
  wherein the first dummy rear connection electrode and the second dummy front connection electrode are not connected with any of the signal through electrodes and the power through electrodes.

8. The semiconductor package according to claim 6,
  wherein the first dummy rear connection electrode and the second dummy front connection electrode are in an electrically floating state.

9. The semiconductor package according to claim 6,
  wherein the first semiconductor chip further comprises:
  a first signal rear connection electrode electrically connected with the first signal through electrode, wherein the first signal rear connection electrode is disposed over the first rear surface of the first body; and
a first power rear connection electrode electrically connected with the pair of first power through connection electrodes, wherein the first power rear connection electrode is disposed over the first rear surface of the first body,
wherein the second semiconductor chip further comprises:
a second signal front connection electrode electrically connected with the second signal through electrode, wherein the second signal front connection electrode is disposed over the second front surface of the second body; and
a second power front connection electrode electrically connected with the pair of second power through connection electrodes, wherein the second power front connection electrode is disposed over the second front surface of the second body,
wherein the first signal rear connection electrode overlaps the second signal front connection electrode, and
wherein the first power rear connection electrode overlaps the second power front connection electrode.

10. A semiconductor package comprising:
a first semiconductor chip; and
a second semiconductor chip and a third semiconductor chip sequentially stacked over the first semiconductor chip,
wherein the second semiconductor chip comprises:
a first body with a first front surface;
a first signal through electrode in the first body;
a pair of first power through electrodes in the first body;
a first signal front connection electrode electrically connected with the first signal through electrode, wherein the first signal front connection electrode is disposed over the first front surface; and
a first power front connection electrode electrically connected with the pair of first power through electrodes, wherein first power front connection electrode is disposed over the first front surface,
wherein the third semiconductor chip comprises:
a second body with a second front surface;
a second signal through electrode in the second body; and
a pair of second power through electrodes in the second body,
wherein the pair of first power through electrodes are electrically connected with the pair of second power through electrodes, and
wherein the second semiconductor chip and the third semiconductor chip are memory chips, and the first semiconductor chip have a logic circuit configured to support operations of the second semiconductor chip and the third semiconductor chip.

11. The semiconductor package according to claim 10, further comprising:
a molding layer covering the first semiconductor chip, the second semiconductor chip, and the third semiconductor chip.

12. The semiconductor package according to claim 11, wherein the molding layer fills:
a first space between the first semiconductor chip and the second semiconductor chip, and
a second space between the second semiconductor chip and the third semiconductor chip.

13. The semiconductor package according to claim 11, further comprising:
a filling material fills:
a first space between the first semiconductor chip and the second semiconductor chip, and
a second space between the second semiconductor chip and the third semiconductor chip.

14. The semiconductor package according to claim 10,
wherein the second semiconductor chip further comprises a first dummy rear connection electrode on a first rear surface of the first body,
wherein the third semiconductor chip further comprises a second dummy front connection electrode on a second front surface of the second body, and
wherein the first dummy rear connection electrode overlaps the second dummy front connection electrode.

15. The semiconductor package according to claim 14,
wherein the first dummy rear connection electrode and the second dummy front connection electrode are not connected with any of the first and second signal through electrodes and the pair of first and second power through electrodes.

16. The semiconductor package according to claim 14,
wherein the first dummy rear connection electrode and the second dummy front connection electrode are in an electrically floating state.

17. The semiconductor package according to claim 14,
wherein the second semiconductor chip further comprises:
a first signal rear connection electrode electrically connected with the first signal through electrode, wherein the first signal rear connection electrode is disposed over the first rear surface of the first body; and
a first power rear connection electrode electrically connected with the pair of first power through connection electrodes, wherein the first power rear connection electrode is disposed over the first rear surface of the first body,
wherein the second semiconductor chip further comprises:
a second signal front connection electrode electrically connected with the second signal through electrode, wherein the second signal front connection electrode is disposed over the second front surface of the second body; and
a second power front connection electrode electrically connected with the pair of second power through connection electrodes, wherein the second power front connection electrode is disposed over the second front surface of the second body,
wherein the first signal rear connection electrode overlaps the second signal front connection electrode, and
wherein the first power rear connection electrode overlaps the second power front connection electrode.

* * * * *